United States Patent [19]

Gries et al.

[11] Patent Number: 5,773,187
[45] Date of Patent: *Jun. 30, 1998

[54] WATER DEVELOPABLE DIAZONIUM AND MINERAL ACID CONTAINING RECORDING MATERIAL FOR PRODUCING WATER-FREE OFFSET PRINTING PLATES

[75] Inventors: Willi-Kurt Gries, Wiesbaden; Klaus-Peter Konrad, Ingelheim; Klaus-Juergen Przybilla, Frankfurt am Main; Hans-Joachim Schlosser, Wiesbaden-Naurod, all of Germany

[73] Assignee: Agfa-Gevaert AG, Leverkusen, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 640,702

[22] Filed: May 1, 1996

[30] Foreign Application Priority Data

May 4, 1995 [DE] Germany .................. 195 15 804.0

[51] Int. Cl.$^6$ .................................................. G03F 7/021
[52] U.S. Cl. .................. 430/162; 430/163; 430/272.1; 430/303
[58] Field of Search .................... 430/303, 162, 430/271.1, 272.1, 273.1, 163

[56] References Cited

U.S. PATENT DOCUMENTS

| | | |
|---|---|---|
| 3,511,178 | 5/1970 | Curtin . |
| 3,677,178 | 7/1972 | Gipe . |
| 3,933,495 | 1/1976 | Kondo et al. . |
| 4,170,481 | 10/1979 | Akama et al. . |
| 4,347,303 | 8/1982 | Asano et al. .............. 430/272 |
| 4,775,607 | 10/1988 | Schlosser ................. 430/162 |
| 4,842,988 | 6/1989 | Herrmann et al. .......... 430/14 |
| 4,937,169 | 6/1990 | Schlosser ................. 430/303 |
| 4,956,262 | 9/1990 | Schlosser et al. ........ 430/303 |
| 4,963,472 | 10/1990 | Schlosser et al. ........ 430/303 |
| 5,017,457 | 5/1991 | Herrmann et al. ........ 430/272 |
| 5,122,438 | 6/1992 | Nogami et al. ........... 430/303 |

FOREIGN PATENT DOCUMENTS

| | | |
|---|---|---|
| 0 349 157 | 1/1990 | European Pat. Off. . |
| 0 394 923 | 10/1990 | European Pat. Off. . |
| 0 394 924 | 10/1990 | European Pat. Off. . |
| 0 426 470 A2 | 8/1991 | European Pat. Off. . |
| 16 71 637 | 9/1971 | Germany . |
| 1 442 374 | 7/1976 | United Kingdom . |

*Primary Examiner*—Christopher G. Young
*Attorney, Agent, or Firm*—Foley & Lardner

[57] ABSTRACT

A radiation-sensitive recording material comprising:

a base;

a radiation-sensitive layer comprising a diazonium salt polycondensation product and 3 to 50% by weight, relative to the total weight of the radiation-sensitive layer, of a mineral acid; and a silicone layer.

26 Claims, No Drawings

WATER DEVELOPABLE DIAZONIUM AND MINERAL ACID CONTAINING RECORDING MATERIAL FOR PRODUCING WATER-FREE OFFSET PRINTING PLATES

BACKGROUND OF THE INVENTION

1. Field of the Invention

The present invention relates to a recording material having a base, a radiation-sensitive layer containing a diazonium salt polycondensation product and a silicone layer. An offset printing plate for water-free printing can be produced from the recording material.

2. Description of Related Art

Recording materials of the type mentioned at the outset and also offset printing plates such as dry planographic printing plates which do not need damping solution, are generally known. For example, the recording material described in DE-A 16 71 637 comprises an aluminum base which carries a layer containing a photosensitive diazonium salt and a silicone layer. During imagewise irradiation, the diazonium salt is decomposed in the areas impinged on by the radiation. The irradiated areas become water-soluble and can be removed together with the areas of the silicone layer which are situated on top thereof, by gentle rubbing with a developer solution, to expose the aluminum base surface. The developer solution is composed, for example, of butyl acetate, propanol and water. The unirradiated areas remain unaltered during the development. These areas repel the ink during printing, whereas the dry aluminum surface takes up the printing ink.

An offset printing plate for water-free printing according to DE-A 15 71 890 and U.S. Pat. No. 3,677,178 is produced from a recording material which comprises a base material to which a diazo layer was first applied, then a silicone layer. The diazo layer is composed, for example, of the zinc double salt of a condensate of formaldehyde and 4-diazodiphenylamine. During imagewise irradiation, those areas of the diazo layer impinged on by the radiation are cured. When subsequently rubbed off with a developer, the unirradiated, that is, the uncured areas of the diazo layer are removed together with the parts of the silicone layer situated on top thereof. Thus, the base material beneath the removed areas is now exposed. Aqueous solutions which contain surface-active substances (surfactants) are generally used as developers. In addition, organic solvents (solvent mixtures) can also be used.

The recording material for producing offset printing plates for water-free printing according to DE-A 23 23 972 and U.S. Pat. No. 3,933,495 comprises a base having a layer about 0.1 to 3 $\mu$m thick containing a photosensitive substance and a layer of a one-component unvulcanized silicone rubber 2 to 5 $\mu$m thick. The photosensitive substance is obtained by reacting a diazonium compound with a polyhydroxybenzophenone at a pH of not more than 7.5. The diazonium compound may be a condensation product of formaldehyde and 4-diazodiphenylamine. In addition, the photosensitive layer may also contain a binder, for example epoxy resin, phenolic resin, polyamide resin, vinylidene chloride resin or cellulose ester. The recording material is then imagewise irradiated through a positive or negative master. The imaged recording material is then treated with an organic solvent, such as cyclohexanone. A solvent is used to remove the irradiated areas of the photosensitive layer together with the areas of the silicone layer situated on top thereof.

According to DE-A 23 50 211 and GB 1 442 374 the silicone layer which is applied to the photosensitive layer is less than 10 $\mu$m thick, and is produced with a coating solution which contains an organopolysiloxane which cures at normal temperature and a two-component unvulcanized silicone rubber which cures by addition polymerization in a certain ratio by weight. The addition polymerization is catalyzed by a palladium or platinum compound. The coating solution can be processed for several hours. The drying is disclosed as being conducted at about 100° to 120° C., after which the silicone layer is resistant to fingerprints. The drying time is only about 1 minute. A finished water-free offset printing plate can be produced from the recording material produced in this way by imagewise exposure and subsequent development with a mixture which is rich in organic solvents. Examples of suitable mixtures are disclosed as including a mixture of xylene, ethylene glycol monomethyl ether acetate and γ-butyrolactone or a mixture of butyl acetate, propanol and water. Aqueous developers cannot be used.

The recording material for producing water-free offset printing plates according to EP-A 0 349 157 also comprises a base, usually of aluminum, a photosensitive layer and a silicone layer as an uppermost layer. The silicone layer is composed of copolymers containing units of a silicone macromer and units of a fluorine-containing monomer. The silicone macromer is generally an organo-polysiloxane having acryloyl or methacryloyl terminal groups, whereas the fluorine-containing monomer is a fluoroalkyl acrylate or methacrylate. The photosensitive layer may contain a condensation product of 4-diazodiphenylamine and formaldehyde as a photosensitive component. In addition, the photosensitive layer includes a polymeric binder, such as a phenol/formaldehyde resin. To produce the water-free offset printing plates, the imagewise irradiated recording material is developed with an organic solvent. Generally, mixtures of an aliphatic or aromatic hydrocarbon, such as hexane or toluene, or a halogenated hydrocarbon and a polar solvent, such as methanol, ethanol or acetone, are used. During the development, those areas of the silicone layer impinged on by light are removed, whereas the originally photosensitive layer situated thereunder remains intact.

EP-A 0 394 923 describes a recording material for producing water-free offset printing plates having an aluminum base material, a photosensitive layer and a silicone layer. The photosensitive layer contains a diazo resin and a polymer containing units of a hydroxyl-group-containing ester or amide of acrylic acid or methacrylic acid. A preferred hydroxyl-group-containing ester of acrylic acid is 2-hydroxyethyl acrylate. As an example of a diazo resin, mention is made of the condensation product of 4-diazodiphenylamine and formaldehyde. Optionally, a primer layer is disposed between the base material and the photosensitive layer. The hydroxyl-group-containing polymers already mentioned may also be present in the primer layer. The photosensitive layer adheres particularly well to the base material. The unvulcanized silicone rubber layer is composed of linear or loosely crosslinked organopolysiloxanes. The crosslinking is performed by addition or condensation reactions. After the imagewise irradiation, the recording material is treated with an aqueous developer. In the areas not impinged on by light, the developer removes the formerly photosensitive layer together with the parts of the silicone layer situated on top thereof.

The recording material according to EP-A 0 394 924 differs from that just described in that some of the diazo resin, mixed with the hydroxyl-group-containing polymer, is present in the primer layer.

In the recording material for producing water-free offset printing plates according to DE-A 35 45 204, the photosensitive layer contains a special diazonium salt polycondensation product. It is produced by condensation of a carbonyl compound with an aromatic diazonium salt and a further aromatic compound, in particular an aromatic amine, a phenol, a phenolic ether, an aromatic thioether, an aromatic hydrocarbon or a heteroaromatic compound. The silicone layer is preferably composed of a multicomponent unvulcanized silicone rubber. The imagewise irradiated recording materials are developed with an organic solvent which is optionally mixed with water or other organic solvents. The developer preferably contains a component which is capable of swelling the silicone layer, and a further component which selectively dissolves the unirradiated areas of the formerly photosensitive layer. With a suitable combination of diazonium salt polycondensation products, binders and developers, it is also possible to dissolve the irradiated layer areas and in this way obtain a negative-working water-free offset printing plate.

Water-free offset printing plates which traditionally have been commercially available are developed either by a one-stage decoating process with hydrocarbon solvents, or by a two-stage development with preliminary swelling in an organic medium at elevated temperature. The two stage development includes subsequent mechanical removal of the silicone layer in the unirradiated regions with the aid of water as transport medium. In both the one-stage and the two stage processes, it is generally necessary to vertically cut through the silicone layer in the boundary areas between irradiated and unirradiated areas. Because of the preliminary swelling, the silicone layer is stripped from the radiation-sensitive layer in this process, with the result being that the unvulcanized silicone rubber can be removed in the unirradiated areas. In the irradiated areas, on the other hand, this stripping process does not occur. Accordingly, the unvulcanized silicone rubber is not mechanically affected and therefore cannot be removed.

SUMMARY OF THE INVENTION

An object of the present invention was therefore to provide a recording material for producing offset printing plates for water-free printing, which can be developed with pure water.

In accordance with these objectives, there is provided a radiation-sensitive recording material comprising a base;

a radiation-sensitive layer comprising a diazonium salt polycondensation product, and 3 to 50% by weight, relative to the total weight of the radiation-sensitive layer, of a mineral acid; and a silicone layer.

In further accordance with these objectives, there is also provided a method for producing a water-free offset printing plate comprising:

imagewise irradiating a recording material to form an irradiated recording material; and developing the irradiated recording material with water.

DETAILED DESCRIPTION OF PREFERRED EMBODIMENTS

The present invention preferably comprises a radiation-sensitive recording material which comprises a base, a radiation-sensitive layer containing a diazonium salt polycondensation product, and also a silicone layer (in that order), wherein the radiation-sensitive layer contains 3 to 50% by weight, relative to the total weight of the radiation-sensitive layer, of a mineral acid. In this connection, it is unnecessary, however, for the totality of the components of the radiation-sensitive layer to be water-soluble. The recording material of the present invention can be developed with pure water and preferably without preliminary swelling of the silicone layer and without organic solvents The mineral acid is preferably a relatively weak mineral acid. "Relatively weak" mineral acids generally include those mineral acids having a $pK_a$ of more than 1.5. In the case of mineral acids having more than one dissociation step, for example phosphoric acid, the $pK_a$ value of interest applies to the first dissociation step in each case. Particularly preferred, relatively weak mineral acids include phosphoric acid ($pK_a$ 2.16) and boric acid ($pK_a$ 9.25).

The base for the radiation-sensitive layer is preferably a metal plate or foil, most preferably of aluminum or one of its alloys. It has proven beneficial to optionally pretreat the base. Thus, the base materials may be mechanically and/or electrochemically grained and then optionally anodized. Thereafter, a further chemical pretreatment, for example with polyvinylphosphonic acid, silicates, phosphates, hexafluorozirconates or hydrolyzed tetraethyl orthosilicate is possible. Steel and chromium are also suitable for the base material. Since, in contrast to conventional planographic printing plates, a hydrophilic base surface is generally unnecessary, copper, brass or other oleophilic metals can also be used. In addition, plastics such as polyester, polycarbonate, polyimide or cellulose acetate are also suitable. Also suitable are rubbery-elastic base materials which can also be employed in direct planographic printing.

In the case of the water-free printing plates which are produced from the recording material according to the invention, the base generally serves as an ink-accepting material. Those areas of the silicone layer left behind after the irradiation and development typically serve as an image background. These areas left behind are ink-repellant. For the purpose of printing, either conventional oil-based printing inks or hydrophilic printing inks which have been specially developed for water-free offset printing and reversed offset printing can be used. The oleophilic printing inks conventional in water-free offset are preferably used.

The diazonium salt polycondensation radiation-sensitive layer preferably comprises the condensation product of an aromatic diazonium salt. Such condensation products are disclosed, for example, in DE-A 12 14 086 and U.S. Pat. No. 3,235,384. They can be prepared, for example, by condensation of a polynuclear aromatic diazonium compound (preferably an unsubstituted or substituted diphenylamine-4-diazonium salt) with active carbonyl compounds (preferably formaldehyde) in strongly acidic medium (preferably concentrated phosphoric acid).

The diazonium salt condensation products mentioned in U.S. Pat. No. 3,867,147 and 4,021,243 are also suitable. The diazonium also contain units without diazonium groups. These units without diazonium groups are preferably derived, for example, from aromatic amines, phenols, phenolic ethers, aromatic thioethers, aromatic hydrocarbons, heteroaromatic compounds or acid amides.

The units containing the diazonium groups are preferably formed from compounds of the formula

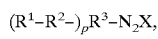

wherein

X is an anion of the condensation product, p is an integer from 1 to 3, $R^1$ is an aromatic radical containing at least one position capable of condensation with an active carbonyl compound, $R^2$ is a single bond or one of the groups —$(CH_2)_q$—NR$^4$—, —O—$(CH_2)_r$—NR$^4$—, —S—$(CH_2)_r$—NR$^4$, —S—CH$_2$—CO—NR$^4$—, —O—R$^5$—O—, —O—, —S— or —CO—NR$^4$—, wherein q is an integer from 0 to 5, r is an integer from 2 to 5, $R^4$ is a hydrogen atom, a ($C_1$-$C_5$)alkyl group, a ($C_7$-$C_{12}$)aralkyl group or a ($C6$-$C_{12}$)aryl group, $R^5$ is a ($C_6$-$C_{12}$)arylene group and $R^3$ is a (p+1)-valent, unsubstituted or substituted benzene radical.

The anion X of the condensation product is preferably chloride, sulfate, hydrogensulfate, hydrogen- or dihydrogenphosphate, hexafluorophosphate, tetrafluoroborate or an unsubstituted or substituted alkanesulfonate or arenesulfonate. Of the last named, methanesulfonate and mesitylenesulfonate are particularly preferred. The nature of the anion affects the solubility of the diazonium salt condensation product.

Particularly preferred are condensation products with unsubstituted or substituted diphenylamine-4-diazonium salts, most particularly with 3-methoxydiphenylamine-4-diazonium salts. The condensation products of the diazonium salts mentioned with formaldehyde or with 4,4'-bismethoxymethyldiphenyl ether are, in particular, readily available. The condensation can be performed in sulfuric, phosphoric or methanesulfonic acid. In this connection, phosphoric acid is particularly preferred. As an option, condensation products can be further processed as solutions in phosphoric acid or in isolated form. The condensation products are stabilized by the presence of mineral acids, such as phosphoric acid or sulfuric acid, or organic acids, such as ptoluenesulfonic acid. The condensation products prepared with aromatic compounds containing two methoxymethyl groups are preferred to those prepared with carbonyl compounds, such as formaldehyde. This is because condensation products prepared with aromatic compounds containing two methoxymethyl groups generally produce recording materials having a higher radiation sensitivity.

The radiation-sensitive layer preferably contains 20 to 97% by weight of diazonium salt polycondensation products. So that it can be developed with water, 3 to 50% by weight, preferably 5 to 45% by weight, of a mineral acid are furthermore added. It is preferable that the mineral acid be relatively weak. In addition, up to 70, more preferably 5 to 40, % by weight, and particularly preferably 10 to 30% by weight, of a polymeric binder or binder mixture is also added. The weight data relate in each case to the total weight of the radiation-sensitive layer.

The binders preferably have polar properties. Nonionic, water-soluble polymers and copolymers, such as polysaccharides, polyethylene oxides, polypropylene oxides, polyoxymethylenes, polyacrylamides, poly(N-vinylamides), polyacrylates, polymethacrylates and polyvinyl alcohols are suitable. Particularly preferred are polymers and copolymers containing vinyl alcohol units. Nonionic, water-insoluble polymers and copolymers such as epoxy resins, acrylate resins or methacrylate resins, cellulose derivatives, are also suitable. Particularly preferred are polyvinyl butyral and polymers derived therefrom. These include, in particular, the reaction products of polyvinyl butyral with dicarboxylic anhydrides, such as maleic anhydride and pyromellitic anhydride.

Finally, the radiation-sensitive layer may also contain additives. The additives may include dyes, pigments, adhesion promoters, surfactants, levellers or other auxiliaries for improving the decoatability and/or the printing properties. The additives should be miscible with the other constituents of the radiation-sensitive layer without undesirable reactions occurring. In addition, they should not absorb the radiation used in the imagewise irradiation too strongly, as this would tend to reduce the radiation sensitivity of the recording material. The proportion of the additives is preferably not more than 20% by weight, most preferably not more than 10% by weight.

The weight of the radiation-sensitive layer in the recording material prior to use, is preferably 0.001 to 3.00 g/m$^2$, more preferably 0.05 to 1.50 g/m$^2$, and particularly preferably 0.1 to 1.0 g/m$^2$.

One of the generally conventional primer layers may be disposed between the radiation-sensitive layer and the base material. If used, the primer layer preferably should not contain any radiation-sensitive compounds.

In principle, any unvulcanized silicone rubber which is sufficiently ink-repellant to permit printing without damping water is suitable for the silicone layer. Here the description "unvulcanized silicone rubber" is to be understood as meaning a high-molecular-weight, essentially linear diorganopolysiloxane in accordance with the definition by Noll in "Chemie und Technologie der Silikone" ("Chemistry and Technology of the Silicones", Verlag Chemie, 1968, page 332). On the other hand, the term "silicone rubber" is used for the crosslinked or vulcanized products. It is generally an unvulcanized silicone rubber which is applied to the radiation-sensitive layer, dried and crosslinked in the process.

The unvulcanized silicone rubbers may be one-component or multicomponent unvulcanized rubbers. Examples of these are described in DE-A 23 50 211, DE-A 23 57 871 and DE-A 23 59 102.

The one-component unvulcanized silicone rubbers are conventionally based on polydimethylsiloxanes which carry hydrogen atoms, acetyl, oxime, alkoxy or amino groups, or other functional groups at their terminal ends. The methyl groups in the chain may be replaced by other alkyl groups, by haloalkyl groups, or by unsubstituted or substituted aryl groups. The terminal functional groups are preferably readily hydrolyzable and should cure in the presence of moisture in a time interval of a few minutes to a few hours.

The multicomponent unvulcanized silicone rubbers can be crosslinked by addition or condensation. The addition-crosslinkable types generally contain two different polysiloxanes. The first polysiloxane is preferably present in a proportion of 70 to 99% by weight and preferably has alkylene groups, most particularly: vinyl groups, which are bound to silicon atoms of the main chain. The other polysiloxane is preferably present in a proportion of 1 to 10% by weight. Hydrogen atoms in the second polysiloxane are preferably bound directly to silicon atoms. The addition reaction then takes place in the presence of about 0.0005 to 0.002% by weight of a platinum catalyst at temperatures of more than 50° C. Multicomponent unvulcanized silicone rubbers have the advantage that they tend to crosslink very rapidly at elevated temperatures of about 100° C. On the other hand, the time in which they can be processed, the so-called "pot life", is often relatively short.

The mixtures which can be crosslinked by condensation preferably contain diorganopolysiloxanes having reactive terminal groups, such as hydroxyl or acetoxy groups. These are preferably crosslinked with silanes or oligosiloxanes in the presence of catalysts. The crosslinking agents preferably are present in a proportion of 2 to 10% by weight relative to the total weight of the silicone layer. The catalysts are preferably present in a proportion of 0.01 to 0.1% by weight, again relative to the total weight of the silicone layer. These combinations also tend react relatively rapidly and therefore generally have only a limited pot life.

The silicone layer may also contain further components. These additional components may serve to obtain additional crosslinking, a better adhesion, a mechanical reinforcement or for dyeing. The further components preferably and present in a proportion of not more than 10% by weight, most preferably not more than 5% by weight, relative in each case to the total weight of the silicone layer.

A preferred mixture is composed of hydroxyl-terminated polydimethylsiloxanes, a silane crosslinking component such as a tetrafunctional or trifunctional alkoxy, acetoxy-, amido-, amino-, aminoxy-, ketoxime- or enoxysilane, a crosslinking catalyst such as an organotin or an organotitanium compound, and optionally further components such as organopolysiloxane compounds containing Si-H bonds, platinum catalysts for a supplementary addition crosslinking, silanes having adhesion-promoting properties, reaction retardants, fillers and/or dyes. The silane crosslinking components mentioned and the reactions occurring in the crosslinking are described by J. J. Lebrun and H. Porte in "Comprehensive Polymer Science", Vol. 5 [1989], 593–609.

After being applied as a layer, the unvulcanized silicone rubbers are crosslinked in a known manner by exposure to moisture, or crosslinked spontaneously at room temperature or at elevated temperatures to form a silicone rubber which is essentially insoluble in organic solvents. The weight of the final silicone layer is preferably 1 to 20 $g/m^2$, preferably 1 to 5 $g/m^2$.

The silicone layer may optionally be covered with a transparent covering foil or a covering film.

In the production of the recording material according to the invention, a solution which contains the constituents of the radiation-sensitive layer is first applied to the base material. A solution containing the constituents of the silicone layer is applied to the dried layer, likewise dried and crosslinked in the process. It is preferred that this second solution leaves the radiation-sensitive layer as unaltered as possible, that is, with as little dissolution as possible. The coating is preferably performed by, for example, casting, spraying, immersion, roll application or with the aid of a liquid film.

Suitable solvents for the constituents of the radiation-sensitive layer include, for example, alcohols, ketones, ethers or water. On the other hand, the constituents of the silicone layer are preferably dissolved in hydrocarbons, such as toluene, xylene, and in particular, in isoparaffins which have a boiling range 100° to 180° C.

The recording material according to the invention is then irradiated under a master, generally a positive master, with actinic radiation, such as with radiation generated by a metal-halide vapour lamp. The exposure to actinic radiation induces a crosslinking of the radiation-sensitive layer. It is assumed, also that irradiation tends to cause a stronger anchorage or adhesion of the formerly radiation-sensitive areas to the base material. .In the unirradiated areas of the radiation-sensitive layer, the adhesion is weaker so that the silicone layer and the radiation-sensitive layer can be removed mechanically by rubbing during the development. An important advantage of using the recording materials according to the present invention is that pure water may be employed for decoating. However, since work is not generally carried out under sterile conditions in print shops, it is beneficial if the water also contains a biocide which prevents the cell growth. The ready-to-use printing plate may also be preserved or stained.

The following examples are intended to illustrate the invention without limitation. In them, pbw denotes part(s) by weight.

EXAMPLE 1

A 0.3 mm thick, electrolytically grained and anodized aluminum plate having an oxide weight of 3.6 $g/m^2$ was hydrophilized with a 0.1%-strength by weight aqueous polyvinylphosphonic acid solution. A solution composed of 38.4 pbw of a diazonium polycondensation product of 1 mol of 3-methoxydiphenylamine-4-diazonium sulfate and 1 mol of 4,4'-bis-methoxymethyloxybisphenol (=4, 4'-bis-methoxymethyldiphenyl ether) isolated as methanesulfonate, 38.4 pbw of an 85%-strength by weight phosphoric acid, 20.0 pbw of a reaction product of polyvinyl butyral and maleic anhydride (as described in DE-A 34 04 366), 2.0 pbw of a 40%-strength by weight methanolic solution of trimethoxy{3-[2-(4-vinyl-benzylamino)ethylamino] propyl}silane hydrochloride (=N-(3-trimethoxysilanyl-propyl)-N'-4-vinylbenzyl)ethylenediamine hydrochloride) and 0.4 pbw of silicone oil in 2627 pbw of ethanol and 3940 pbw of diethylene glycol monomethyl ether was applied to said base material and then dried for 2 min at 120° C. The weight of the radiation-sensitive layer was then about 0.2 $g/m^2$.

A solution composed of 90.5 pbw of a hydroxyl-terminated polydimethyl-siloxane (viscosity: 5000 mpa·s at 20° C.), 9.4 pbw of triacetoxyvinylsilane and 0.1 pbw of dibutyltin diacetate in 909 pbw of isoparaffin (initial boiling point 118° C.)

was then applied to the radiation-sensitive layer and drying was subsequently dried circulating air for 3 min at 120° C. The weight of the silicone layer was then about 2.4 $g/m^2$.

A positive master was placed on the recording material produced in this way. It was then irradiated through the master for 20 s using a 5 kW metal-halide lamp which was situated at a distance of 110 cm. The recording material imagewise irradiated in this way was then wetted with water and developed ("decoated") in the course of one minute by rubbing with a soft cloth. In this process, those areas of the photosensitive layer not impinged on by the radiation and the silicone layer were removed, with the result that the base material was laid bare in these areas. The image points were dyed with water-free offset printing ink to improve the visualization. The printing plate yielded clean impressions with a high resolution.

It was possible to develop the irradiated recording material with an equally good result also by other, already conventional methods in commercially available development units.

In one of these methods, the imagewise irradiated recording material was pre-swollen for about 1 min using a solution heated to 43° to 45° C. (machine activator "PP-1" supplied by Toray Ind., Inc.), which is essentially composed of polypropylene glycol; it was then brushed with water and subsequently aftertreated with an aqueous solution ("PA-1" supplied by Toray Ind., Inc.) which contained a surfactant, dye and amphiphilic polymer.

EXAMPLES 2 to 9

Radiation-sensitive recording materials were produced as described in Example 1. The compositions of the coating solutions used to produce the radiation-sensitive layers are specified in Table 1.

The coating was then dried as in Example 1. After drying, the weight of the radiation-sensitive layer was 0.2 g/m² in Examples 2 to 4 and 6, respectively, and 0.3 g/m² in Examples 5 and 7 to 9, respectively.

The silicone layer was then produced by applying a solution composed of

- 88.5 pbw of hydroxyl-terminated polydimethyl-siloxane (viscosity: 5000 mpa·s at 20° C.),
- 9.4 pbw of triacetoxyvinylsilane,
- 0.1 pbw of dibutyltin diacetate,
- 1.0 pbw of polyhydrogenmethylsiloxane (viscosity: 15 to 30 mpa·s at 25° C.) and
- 1.0 pbw of platinum catalyst (Wacker OL supplied by Wacker GmbH) in
- 809 pbw of isoparaffin (initial boiling point: 118° C.).

After coating, drying was carried out for 3 min at 120° C. The weight of the silicone layer was then 2.43 g/m² in each case. Irradiation and development was carried out as in Example 1.

EXAMPLE 10

The base material described in Example 1 was coated with a solution composed of

- 84.2 pbw of a diazonium polycondensation product of 1 mol of 3-methoxydiphenylamine-4-diazonium chloride and 1.1 mol of paraformaldehyde (50%-strength by weight in phosphoric acid),
- 13.8 pbw of a copolymer of acrylic acid and 1-hexadecene (molar ratio 2:1), 50% of whose carboxyl groups are esterified with polyethylene glycol (6 to 10 ethylene oxide units), having a mean molecular weight $M_w$ of 20,000,
- 0.8 pbw of Victoria Blue FBR (Basic Blue 55),
- 0.8 pbw of a 40%-strength by weight methanolic solution of trimethoxy{3-[2-(4-vinyl-benzylamino)ethylamino]propyl}silane hydrochloride and
- 0.4 pbw of silicone oil ($^{(R)}$Edaplan LA 411) in
- 2060 pbw of ethanol,
- 937 pbw of diethylene glycol monomethyl ether and
- 749 pbw of water.

After drying as in Example 1, the weight of the radiation-sensitive layer was 0.3 g/m². A solution composed of

- 88.5 pbw of a hydroxyl-terminated polydimethyl-siloxane (viscosity: 80,000 mPa·s at 20° C.),
- 9.4 pbw of triacetoxyvinylsilane,
- 0.1 pbw of dibutyltin diacetate,
- 1.0 pbw of polyhydrogenmethylsiloxane (viscosity: 15 to 30 mPa·s at 25° C.) and
- 1.0 pbw of platinum catalyst (Wacker OL) in
- 1329 pbw of isoparaffin (initial boiling point 118° C.)

was then applied on top thereof. After drying as in Example 1, the weight of the silicone layer was 3.11 g/m².

After imagewise irradiation, it was possible to decoat the recording material perfectly with water without residues being left behind in the unirradiated areas. The water-free offset printing plates produced in this way exhibited a good resolution.

EXAMPLES 11 to 16

The base material mentioned in Example 1 was coated in each case with a solution composed of

- 38.4 pbw of a diazonium polycondensation product of 1 mol of 3-methoxydiphenylamine-4-diazonium sulfate and 1 mol of 4,4'-bis-methoxymethyloxybisphenol (=4,4'-bis-methoxymethyldiphenyl ether), isolated as mesitylenesulfonate,
- 2.0 pbw of an 85%-strength by weight phosphoric acid,
- 20.0 pbw of a reaction product of polyvinyl butyral and maleic anhydride (as described in DE-A 34 04 366),
- 5.0 pbw of Victoria Blue FBR (Basic Blue 55),
- 2.0 pbw of a 40%-strength by weight methanolic solution of trimethoxy{3-[2-(4-vinyl-benzylamino)ethylamino]propyl}silane hydrochloride (=N-(3-trimethoxysilanyl-propyl)-N'-(4-vinylbenzyl)ethylenediamine hydrochloride),
- 31.4 pbw of an additive and
- 0.4 pbw of silicone oil in
- 2627 pbw of ethanol and
- 3940 pbw of diethylene glycol monomethyl ether and dried as described above. The weight of the radiation-sensitive layer after drying was 0.1 g/m² in Example 11 and 0.2 g/m² in Examples 12 to 14 and 16. In Example 15, the radiation-sensitive layer was nonhomogeneous since insoluble constituents had precipitated from the coating solution. It was therefore not possible to determine an exact layer weight in this example.

A silicone layer which was identical to the one mentioned in Example 1 was then applied in each case.

The recording materials produced in this way were then imagewise irradiated and treated with water.

EXAMPLE 11 (COMPARISION EXAMPLE)

No additive was used. A decoating with water was not possible.

EXAMPLE 12

As additive, 85%-strength by weight phosphoric acid was used. The decoatability with water was very good. There were no layer residues of any kind in the unirradiated areas.

EXAMPLE 13 (COMPARISOIN EXAMPLE)

Polyethylene glycol 400 was used as additive. A decoating with water was not possible.

EXAMPLE 14 (COMPARISON EXAMPLE)

A copolymer of acrylic acid and 1-hexadecene (molar ratio 2:1), 50% of whose carboxyl groups were esterified with polyethylene glycol (6 to 10 ethylene oxide units) and which had a molecular weight $M_w$ of 20,000 ($^{(R)}$Dapral GE 202) was used as additive. During the decoating with water, the silicone layer was completely removed, i.e. in the irradiated and the unirradiated areas. A usable printing form was not obtained.

EXAMPLE 15 (COMPARISON EXAMPLE)

Polyphosphoric acid was used as additive. It was not possible to produce a usable recording material.

EXAMPLE 16

Boric acid was used as additive. The decoatability with water was very good. There were no layer residues of any kind in the unirradiated areas.

EXAMPLES 17 to 20

As in Example 1, base materials were coated in each case with a solution composed of 48.8 pbw of a diazonium polycondensation product of 1 mol of 3-methoxydiphenylamine-4-diazonium chloride In the case of the recording materials according to Examples 17 to 20, the decoatability with water after the imagewise irradiation was very good in all cases. There were no layer residues of any kind in the unirradiated areas.

TABLE 1

| Components in parts by weight | Examples | | | | | | | |
|---|---|---|---|---|---|---|---|---|
| | 2 | 3 | 4 | 5 | 6 | 7 | 8 | 9 |
| 1) | 63.8 | 63.8 | — | — | 63.8 | 63.8 | — | — |
| 2) | — | — | 63.8 | 63.8 | — | — | 63.8 | 63.8 |
| 3) | 23.8 | 23.8 | 23.8 | 23.8 | — | — | — | — |
| 4) | — | — | — | — | 23.8 | 23.8 | 23.8 | 23.8 |
| 5) | 5 | 5 | 5 | 5 | 5 | 5 | 5 | 5 |
| 6) | 2 | 2 | 2 | 2 | 2 | 2 | 2 | 2 |
| 7) | 0.4 | 0.4 | 0.4 | 0.4 | 0.4 | 0.4 | 0.4 | 0.4 |
| $H_3PO_4$ (85%-strength) | 5 | 15 | 5 | 15 | 5 | 15 | 5 | 15 |
| Ethanol | 2627 | 2627 | 2627 | 2627 | 3612 | 3612 | 3612 | 3612 |
| Diethylene glycol | 3940 | 3940 | 3940 | 3940 | 1642 | 1642 | 1642 | 1642 |
| Water | — | — | — | — | 1313 | 1313 | 1313 | 1313 |

1)Diazonium polycondensation product of 1 mol of 3-methoxydiphenylamine-4-diazonium salt and 1 mol of 4,4'-bismethoxymethyldiphenyl ether, isolated as hydrogensulfate
2)Diazonium polycondensation product of 1 mol of 3-methoxydiphenylamine-4-diazonium salt and 1 mol of 4,4'-bismethoxymethyldiphenyl ether, isolated as mesitylenesulfate
3)Polyvinyl butyral (80% vinyl butyral units, 18% vinyl alcohol units, 2% vinyl acetate units, $T_g$ 72 to 78° C.
4)Partially saponified polyethylene glycol/vinyl acetate graft polymer (residual acetal content 11.7% by weight, ester number 155 mg of KOH/g)
5)Victoria Blue FBR (Basic Blue 55)
6)40%-strength by weight methanolic solution of trimethoxy {3-[2-(4-vinylbenzylamino)ethylamino]propyl} silane hydrochloride
7)Silicone oil and 1.1 mol of paraformaldehyde (50%-strength by weight in phosphoric acid), 10.0 pbw of a diazonium polycondensation product of 1 mol of 3-methoxydiphenylamine-4-diazonium salt and 1 mol of 4,4'-bis-methoxymethyldiphenyl ether, isolated as mesitylenesulfonate, 20.0 pbw of partially saponified polyethylene glycol/vinyl acetate graft polymer (residual acetal content: 11.7% by weight, ester number: 155 mg of KOH per gram), 13.8 pbw of a copolymer of acrylic acid and 1-hexadecene (molar ratio 2:1), 50% of whose carboxyl groups are esterified with polyethylene glycol (6 to 10 ethylene oxide units), having a mean molecular weight $M_w$ of 20,000, 5.0 pbw of Victoria Blue FBR (Basic Blue 55), 2.0 pbw of a 40%-strength by weight methanolic solution of trimethoxy(3-[2-(4-vinyl-benzylamino)ethylamino]propyl)silane hydrochloride and 0.4 pbw of silicone oil ((R)Edaplan LA 411) in 2145 pbw of ethanol, 975 pbw of diethylene glycol monomethyl ether and 780 pbw of water and dried as described. After drying, the weight of the radiation-sensitive layer was 0.2 g/m² in each case.

A different silicone layer was then applied to the radiation-sensitive layer in each case. The compositions of the unvulcanized silicone rubber solutions used for coating are specified in Table 2. The weight of the dried silicone layer was 3.0 g/m² in Example 17, 3.3 g/m² in Example 18, 3.8 g/m² in Example 19 and 3.5 g/m² in Example 20.

TABLE 2

| Components | Examples | | | | |
|---|---|---|---|---|---|
| | 17 pbw | 18 pbw | 19 pbw | 20 pbw | 21 pbw |
| 1) | 88.5 | 90.5 | 80.5 | 88.5 | 90.5 |
| Vinylacetoxysilane | 9.4 | 9.4 | 9.4 | 7.4 | — |
| Dibutyltin diacetate | 0.1 | 0.1 | 0.1 | 0.1 | 0.1 |
| 2) | 1.0 | — | 1.0 | 1.0 | — |
| 3) catalyst | 1.0 | — | 1.0 | 1.0 | — |
| 4) dye dispersion | — | — | 8.0 | — | — |
| 5) | — | — | — | 2.0 | — |
| 6) | — | — | — | — | 7.4 |
| 7) | — | — | — | — | 2.0 |
| Isoparaffin, b.p. > 118° C. | 809 | 900 | 809 | 809 | 1011 |

1) Hydroxyl-terminated polydimethylsiloxane (viscosity 50,000 mPa · s at 20° C.)
2) Polyhydrogenmethylsiloxane (viscosity 15 to 30 mPa · s at 25° C.)
3) Pt catalyst (Wacker OL)
4) 20%-strength dispersion of Pigment Blue 15:3 (C.I. 74160) and hydroxyl-terminated polydimethylsiloxane (viscosity 50,000 mPa · s at 20° C.) in the ratio 1:1 in toluene
5) Glycidopropyltrimethoxysilane
6) Vinyltris(methylethylketoxime)silane
7) 3-(2-aminoethylamino)propyltrimethoxysilane(=$H_2N(CH_2)_2NH-(CH_2)_3-Si(OCH_3)_3$ Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A water-developable radiation-sensitive recording material comprising in the following order:
   a base;
   a radiation-sensitive layer comprising a diazonium salt polycondensation product and 3 to 50% by weight, relative to the total weight of the radiation-sensitive layer, of a mineral acid; and
   a silicone layer in contact with said radiation sensitive layer.

2. A recording material as claimed in claim 1, wherein the radiation-sensitive layer contains 5 to 45% by weight, relative to the total weight of the radiation-sensitive layer, of said mineral acid.

3. A recording material as claimed in claim 1, wherein the mineral acid has a $pK_a$ value of more than 1.5.

4. A recording material as claimed in claim 3, wherein the mineral acid is phosphoric acid or boric acid.

5. A recording material as claimed in claim 1, wherein the base is a metal plate or foil.

6. A recording material as claimed in claim 1, wherein the base commprises aluminum or an aluminum alloy.

7. A recording material as claimed in claim 1, wherein the radiation-sensitive layer contains a condensation product of an aromatic diazonium salt.

8. A recording material as claimed in claim 7, wherein the condensation product of an aromatic diazonium salt is a condensation product of an unsubstituted or substituted diphenylamine-4-diazonium salt, with formaldehyde or 4,4'-bismethoxymethyldiphenyl ether.

9. A recording material as claimed in claim 1, wherein the radiation-sensitive layer contains up to 70% by weight relative to the total weight of the radiation-sensitive layer, of a polymeric binder or binder mixture.

10. A recording material as claimed in claim 1, wherein the radiation-sensitive layer contains 5 to 40% by weight, relative to the total weight of the radiation-sensitive layer, of said polymeric binder or binder mixture.

11. A recording material as claimed in claim 1, wherein the radiation-sensitive layer contains 10 to 30% by weight, relative to the total weight of the radiation-sensitive layer, of said polymeric binder or binder mixture.

12. A recording material as claimed in claim 9, wherein the polymeric binder or binder mixture is polar.

13. A recording material as claimed in claim 12, wherein the polymeric binder or binder mixture comprises at least one nonionic, water-soluble polymer or copolymer selected from the group consisting of polysaccharide, polyethylene oxide, polypropylene oxide, polyoxy-methylene, polyacrylamide, poly(N-vinylamide), polyacrylate, polymethacrylate and polyvinyl alcohol.

14. A recording material as claimed in claim 12, wherein the polymeric binder or binder mixture comprises at least one nonionic, water-insoluble polymer or copolymer selected from the group consisting of epoxy resin, acrylate resin or methacrylate resin, cellulose derivative, polyvinyl butyral or polymer derived therefrom, and a reaction product of polyvinyl butyral with dicarboxylic anhydrides.

15. A recording material as claimed in claim 1, wherein the weight of the radiation-sensitive layer is 0.001 to 3.00 g/m².

16. A recording material as claimed in claim 1, wherein the weight of the radiation-sensitive layer is 0.05 to 1.50 g/m².

17. A recording material as claimed in claim 1, wherein the weight of the radiation-sensitive layer is 0.1 to 1.0 g/m².

18. A recording material as claimed in claim 1, wherein the silicone layer is produced from a one-component or multicomponent unvulcanized rubber.

19. A recording material as claimed in claim 1, wherein the weight of the silicone layer is 1 to 20 g/m².

20. A recording material as claimed in claim 1, wherein the weight of the silicone layer is 1 to 5 g/m².

21. A recording material as claimed in claim 1, which upon imagewise irradiation, is decoatable with water.

22. A recording material as claimed in claim 1, wherein the diazonium salt polycondensation product is derived from compounds of the formula

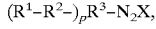

wherein

X is an anion of the diazonium salt polycondensation product, p is an integer from 1 to 3, $R^1$ is an aromatic radical containing at least one position capable of condensation with an active carbonyl compound, $R^2$ is a single bond or one of the groups —$(CH_2)_q$—$NR^4$—, —O—$(CH_2)_r$—$NR^4$—, —S— $(CH_2)_r$—$NR^4$—, —S—$CH_2$—CO—$NR^4$—, —O—$R^5$ —O—, —O—, —S— or —CO—$NR^4$—, wherein q is an integer from 0 to 5, r is an integer from 2 to 5, $R^4$ is a hydrogen atom, a $(C_1$–$C_5)$alkyl group, a $(C_7$–$C_{12})$aralkyl group or a $(C_6$–$C_{12})$aryl group, $R^5$ is a $(C_6$–$C_{12})$arylene group and $R^3$ is a (p+1)-valent, unsubstituted or substituted benzene radical.

23. A recording material as claimed in claim 22, wherein the anion X of the condensation product is selected from the group consisting of chloride, sulfate, hydrogensulfate, hydrogen- or dihydrogenphosphate, hexafluorophosphate, tetrafluoroborate and an unsubstituted or substituted alkanesulfonate or arenesulfonate.

24. A radiation-sensitive recording material as claimed in claim 1, wherein after being exposed to imagewise radiation, said recording material is capable of being developed using pure water.

25. A radiation-sensitive recording material as claimed in claim 1, wherein after being exposed to imagewise radiation, said recording material is capable of being developed using pure water within one minute.

26. A method for producing a water-free offset printing plate comprising:
   imagewise irradiating a recording material as claimed in claim 1 to form an irradiated recording material; and
   developing said irradiated recording material with water.

* * * * *